United States Patent [19]

Schnable et al.

[11] Patent Number: 5,053,345
[45] Date of Patent: Oct. 1, 1991

[54] METHOD OF EDGE DOPING SOI ISLANDS

[75] Inventors: George L. Schnable, Lansdale, Pa.; Albert W. Fisher, Ringoes, N.J.

[73] Assignee: Harris Corporation, Melbourne, Fla.

[21] Appl. No.: 306,356

[22] Filed: Feb. 20, 1989

[51] Int. Cl.[5] ............... H01L 21/225; H01L 21/265
[52] U.S. Cl. ................................. 437/21; 437/158; 148/DIG. 31; 148/DIG. 44
[58] Field of Search ............ 437/21, 158, 80; 148/DIG. 31, DIG. 44, DIG. 150

[56] References Cited

U.S. PATENT DOCUMENTS

| | | | |
|---|---|---|---|
| 3,890,632 | 6/1975 | Ham et al. | 357/56 |
| 4,070,211 | 1/1978 | Harari | 357/56 |
| 4,199,860 | 4/1980 | Beelitz et al. | 437/65 |
| 4,393,572 | 7/1983 | Policastro et al. | 357/56 |
| 4,649,626 | 3/1987 | Leong | 437/158 |
| 4,666,556 | 5/1987 | Fulton et al. | 437/67 |

Primary Examiner—Olik Chaudhuri
Attorney, Agent, or Firm—K. R. Glick

[57] ABSTRACT

SOI islands having doped edges are formed by providing over the surface of a layer of single crystalline silicon on an insulating substrate a masking layer formed of two layers, the lowermost layer adjacent the silicon layer being silicon oxide and the uppermost layer being silicon nitride. The masking layer is defined using standard photolithographic techniques and etching to form the masking layer over only the areas of the silicon layer which are to form the islands. The uncovered portion of the silicon layer is then removed by etching to form the islands. The lowermost layer of the masking layer is then etched laterally away from the edges of the island to expose a portion of the surface of the silicon layer adjacent the edges of the islands. After removing the uppermost layer of the masking layer, the exposed edge portions of the surface of the silicon layer are doped by ion implantation to form the islands with doped edges.

11 Claims, 2 Drawing Sheets

METHOD OF EDGE DOPING SOI ISLANDS

FIELD OF THE INVENTION

The present invention relates to a method of doping the edges of the silicon-on-insulator (SOI) silicon islands, and, more particularly to a self-aligned method of doping the edges of the islands.

BACKGROUND OF THE INVENTION

Silicon-on-insulator (SOI) integrated circuits include islands of single-crystalline silicon on the surface of a substrate of an insulating material, such as sapphire or silicon oxide. Electrical components, such as MOS transistors, are formed in the islands and are electrically connected to form a desired electrical circuit. The MOS transistor includes source and drain regions in the island spaced by a channel region. A gate line of a conductive material, such as conductive polycrystalline silicon, extends across the channel region and is insulated therefrom by a layer of an insulating material, such as silicon oxide. The gate line extends not only across the top surface of the island, but also across the side edges of the island so that the gate line can be electrically connected to other MOS transistors.

Where the gate line extends across the side edges of the island, there is formed a parasitic transistor which adversely affects the characteristics of the MOS transistors, particularly in N-channel MOS transistors. As described in U.S. Pat. No. 3,890,632 to W.E. Ham et al., issued June 17, 1975, entitled STABILIZED SEMICONDUCTOR DEVICES AND METHOD OF MAKING SAME, one technique which has been used to eliminate the parasitic transistor is to dope the edges of the islands with a dopant of the same conductivity type as that of the island. In order to control the width of the doped region along the edges of the island, it would be desirable to have a self-aligned method of doping the edge. One self-aligned method which has been used is described in U.S. Pat. No. 4,393,572, issued July 19, 1983 to Policastro and Woo, entitled METHOD OF MAKING LOW LEAKAGE N-CHANNEL SOS TRANSISTORS UTILIZING POSITIVE PHOTORESIST MASKING TECHNIQUES. However, this method is relatively complex in that it used an additional photoresist step and back side exposure to achieve the self alignment of the patterns relative to the silicon island. Another self-aligned method is described in U.S. Pat. No. 4,070,211 to E. Harari, issued Jan. 24, 1978, entitled TECHNIQUE FOR THRESHOLD CONTROL OVER EDGES OF DEVICES ON SILICON-ON-SAPPHIRE. However, this method requires very thick masking layers to be deposited over the silicon islands. Therefore, it would be desirable to have a self-aligned method of doping the island edges which is less complex and does not require additional photoresist steps.

SUMMARY OF THE INVENTION

A method of forming an edge-doped island of single crystalline silicon on the surface of an insulating substrate includes forming a layer of single-crystalline silicon on the surface of the substrate. A masking layer is then formed on the area of the silicon layer which is to form the island. The masking layer is formed of two layers, the lowermost of which is of a material which can be etched by an etchant which does not substantially etch the material of the uppermost layer. The uncovered portion of the silicon layer is then removed to form an island. The outer edges of the lowermost layer of the masking layer are then etched away under the uppermost layer to expose a portion of the edge of the top surface of the island. The exposed portion of the edge of the island is then doped to form the edge-doped island. Preferably, before doping the exposed portion of the edge of the island, the uppermost layer of the masking layer is removed.

DETAILED DESCRIPTION OF PREFERRED EMBODIMENT

Figure 1:
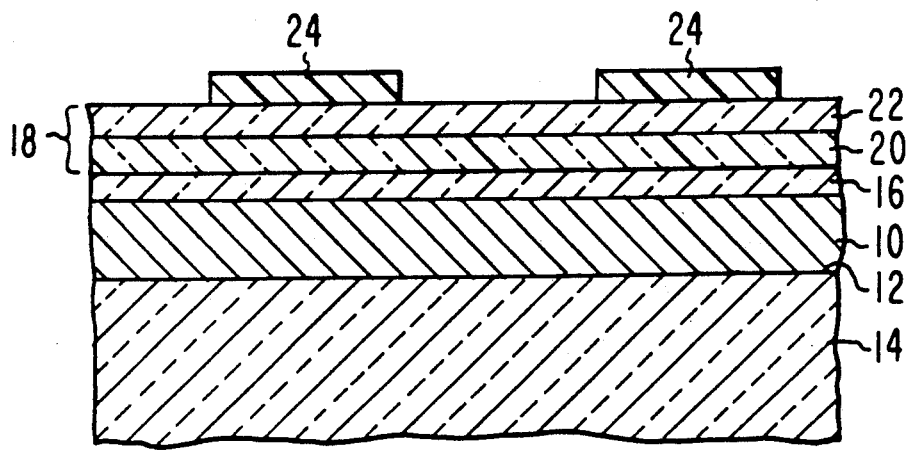
FIGS. 1 through 5 are sectional views illustrating the various steps in sequence of the method of the present invention for doping the edge of a SOI island.

Referring to FIG. 1, the method of the present invention starts with forming a layer 10 of single-crystalline silicon on a surface 12 of an insulating substrate 14. If the substrate 14 is of sapphire, the silicon layer 10 can be epitaxially deposited on the surface 14. However, if the insulating substrate is a layer of silicon oxide on a wafer, such as of silicon, the single crystalline silicon layer can be deposited as amorphous or polycrystalline silicon and then converted to single crystalline, such as the well known zone melting and recrystallization technique. The silicon layer 10 is generally of a thickness of between 0.3 and 0.6 micrometers. A thin layer 16, about 400 angstroms in thickness, of silicon oxide is then grown on the silicon layer 10. This can be achieved by heating the silicon layer 10 at 850° C. in water vapor or an oxygen containing atmosphere.

A masking layer 18 is then formed over the silicon oxide layer 16. The masking layer 18 is formed of two layers 20 and 22. The lowermost layer 20 is of silicon oxide and is about 1.0 micrometers in thickness. The lowermost layer 20 is preferably deposited by a chemical vapor deposition technique wherein the silicon oxide layer 16 is exposed to a mixture of a gas containing a silicon compound, such as silane, and a gas containing oxygen, and heated to about 800° C. The gases react to form silicon oxide which deposits on the silicon oxide layer 16. The lowermost layer 20 can also be formed using a low temperature chemical vapor deposition method at about 400° C. followed by a densification step at about 800° C. The uppermost layer 22 is of silicon nitride and is about 1000 angstroms in thickness. The silicon nitride layer 22 may also be deposited by a chemical vapor deposition technique. To deposit the silicon nitride layer 22, the silicon oxide layer 20 is exposed to a mixture of a gas containing a silicon compound, such as silane, and a gas containing a nitrogen compound, such as ammonia, which is heated to a temperature at which the gases react to form silicon nitride which deposits on the silicon oxide layer 20.

Figure 2:
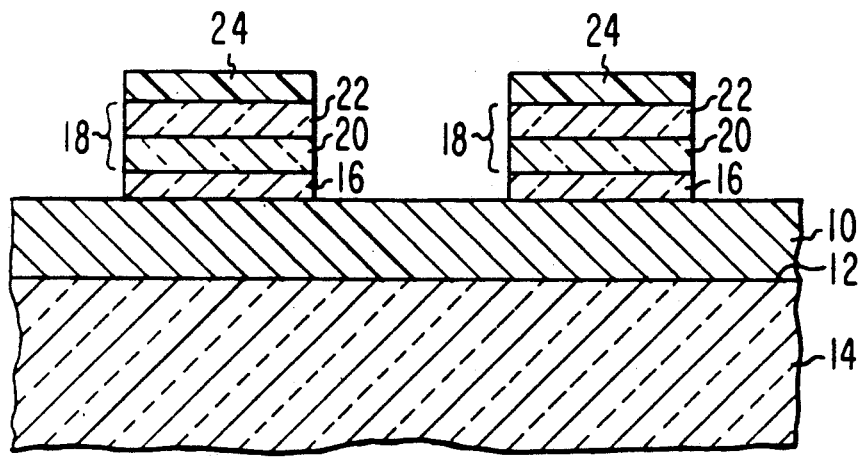
Figure 3:
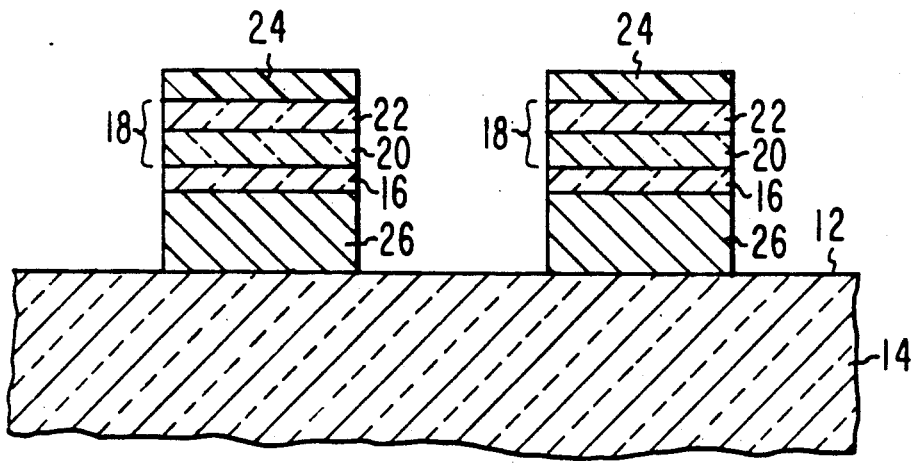

A second masking layer 24, such as of a photoresist material, is provided on the masking layer 18 over the areas of the silicon layer 14 which are to form the silicon islands. This may be achieved by coating the entire masking layer 18 with a layer of the second masking material and then defining the second masking material, such as by standard photolithographic techniques, to form the masking areas 24. As shown in FIG. 2, the exposed areas of the silicon nitride layer 22, the silicon oxide layer 20 and the silicon oxide layer 16 are then removed to expose areas of the silicon layer 18. This can be achieved either with suitable wet chemical etchants or by reactive ion etching. As shown in FIG. 3, the exposed areas of the silicon layer 14 are then removed, such as by reactive ion etching, to form the silicon islands 26 which are covered by the masking layer 18 and the second masking layer 24. The second resist masking layer 24 can then be removed with a suitable solvent. However, if desired, the second resist making layer 24 can be removed prior to removing the exposed areas of the silicon layer 14.

Figure 4:
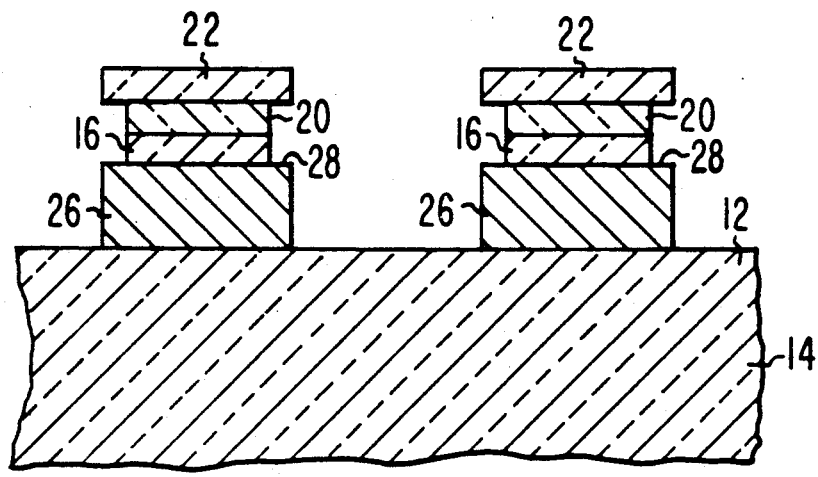

As shown in FIG. 4, the device is then subjected to a wet chemical etch which etches silicon oxide but does not readily etch silicon nitride, such as buffered hydrofluoric acid. This laterally etches back the edges of the silicon oxide layers 16 and 20 from the edges of the islands 26 so as to expose a portion of the upper surface 28 of the islands 26 at the edges thereof. The silicon nitride layer 22 masks the upper surface of the silicon oxide layer 20 so that the silicon oxide layers 16 and 20 are only etched from their exposed edges. Since the etching rate of the etchant is known, the width of the upper surface 28 exposed by this etching step can be easily controlled. Generally, only a few tenths of a micron of the upper surface 28 is exposed.

Figure 5:
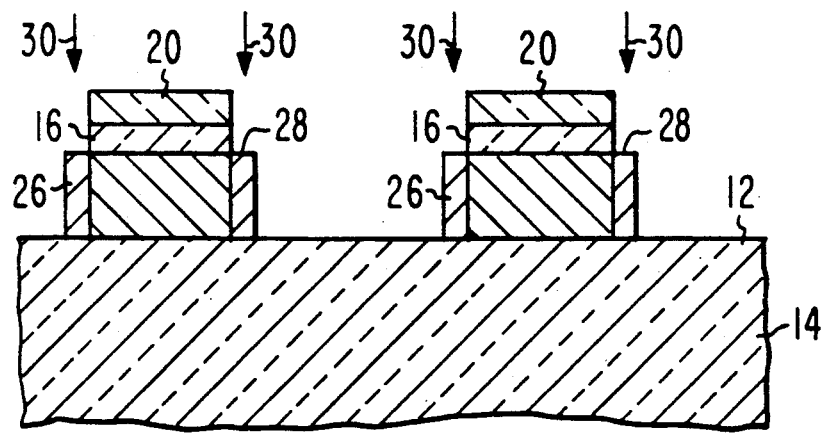

Following the exposure of the portion of the upper surface 28 of the islands 26 around the edges of the islands 26, the silicon nitride layer 22 is selectively removed. This can be achieved by etching in either $H_3PO_4$ at 180° C. or a mixture of $H_3PO_4$ and $H_2SO_4$ at 150° C. As shown in FIG. 5, the device is now subjected to an ion implantation, as indicated by the arrows 30, to dope the edges of the islands 26. For an island of P type conductivity, the edges are doped with boron to make them more highly doped P-type. The silicon oxide layers 16 and 20 can now be removed with a suitable etchant, such as buffered hydrofluoric acid. The islands 26 are now in condition to have MOS transistor formed therein by standard techniques.

In the method of the present invention, only a single photoresist step is used, which is the normal photoresist step which has been used to form the islands. The exposure of the edge portions of the upper surface of the islands is achieved by a simple selective etching step. This step can be easily controlled so as to provide accurate control of the width of the portion of the upper surface exposed so as to provide control of the width of the edge doped region. Thus, there is provided by the present invention a self-aligned method of edge doping the islands of a SOI device which provides good control of the width of the doped region without any additional photoresist steps and using simple etching techniques.

We claim:

1. A method of forming edged doped islands of single crystalline silicon on an insulating substrate comprising the steps of:
   forming a layer of single-crystalline silicon on the surface of an insulating substrate;
   forming on an area of the silicon layer which is to form the island a masking layer formed of two layers, the lowermost layer of the masking layer adjacent the silicon layer being of a material which can be etched by an etchant which will not substantially etch the material of the uppermost layer;
   removing the portions of the silicon layer not covered by the masking layer to form the islands;
   etching the edges of the lowermost layer of the masking layer laterally back from the edges of the island so as to expose a portion of the edge of the top surface of the island; and then
   doping the exposed edge portion of the island.

2. A method in accordance with claim 1 in which the lowermost layer of the masking layer is of silicon oxide and the uppermost layer of the masking layer is of silicon nitride.

3. A method in accordance with claim 2 in which the two layers of the masking layer are formed over the entire outer surface of the silicon layer, a second masking layer is provided over the uppermost layer of the masking layer over the area of the silicon layer which is to form the island, and the exposed areas of the masking layer are removed.

4. A method in accordance with claim 3 in which the uncovered areas of the masking layer are removed by etching to the surface of the silicon layer.

5. A method in accordance with claim 4 in which the masking layer is etched by reactive ion etching.

6. A method in accordance with claim 5 in which the uncovered areas of the silicon layer are removed by reactive ion etching.

7. A method in accordance with claim 4 in which the lowermost layer of the masking layer is etched laterally by means of a wet chemical etch that does not substantially etch the uppermost layer of the masking layer.

8. A method in accordance with claim 4 in which after etching the lowermost layer of the masking layer laterally and before doping the exposed edge portion of the island, the uppermost layer of the masking layer is removed.

9. A method in accordance with claim 8 in which the uppermost layer of the masking layer is removed by reactive ion etching.

10. A method in accordance with claim 8 in which the uppermost layer of the masking layer is removed by etching with an etchant containing $H_3PO_4$.

11. A method in accordance with claim 8 in which the exposed edge area of the island is doped by ion implantation.

* * * * *

UNITED STATES PATENT AND TRADEMARK OFFICE
CERTIFICATE OF CORRECTION

PATENT NO. : 5,053,345
DATED : October 1, 1991
INVENTOR(S) : George Luther Schnable and Albert Wayne Fisher It is certified that error appears in the above-indentified patent and that said Letters Patent is hereby corrected as shown below:

TITLE PAGE:

Line 6, after "Filed:"  Delete "Feb. 20, 1989" and
Insert "Feb. 6, 1989"

Signed and Sealed this

Twelfth Day of July, 1994

Attest:

BRUCE LEHMAN

*Attesting Officer*  *Commissioner of Patents and Trademarks*